US011718727B2

(12) United States Patent
Fünderich et al.

(10) Patent No.: US 11,718,727 B2
(45) Date of Patent: Aug. 8, 2023

(54) METHOD FOR MANUFACTURING ELECTRICALLY CONDUCTIVE STRUCTURES ON A CARRIER MATERIAL

(71) Applicant: Chemische Fabrik Budenheim KG, Budenheim (DE)

(72) Inventors: Sven Fünderich, Norheim (DE); David Garcia Martinez, Saragossa (ES); Thomas Futterer, Ingelheim (DE); Christian Litterscheid, Ober-Olm (DE); Rüdiger Wissemborski, Gau-Algesheim (DE); Jorge Flores, Kronberg im Taunus (DE)

(73) Assignee: Chemische Fabrik Budenheim KG, Budenheim (DE)

( * ) Notice: Subject to any disclaimer, the term of this patent is extended or adjusted under 35 U.S.C. 154(b) by 113 days.

(21) Appl. No.: 16/496,591

(22) PCT Filed: Mar. 26, 2018

(86) PCT No.: PCT/EP2018/057662
§ 371 (c)(1),
(2) Date: Sep. 23, 2019

(87) PCT Pub. No.: WO2018/178022
PCT Pub. Date: Oct. 4, 2018

(65) Prior Publication Data
US 2020/0032028 A1 Jan. 30, 2020

(30) Foreign Application Priority Data
Mar. 30, 2017 (DE) .................... 10 2017 106 913.5

(51) Int. Cl.
| | | |
|---|---|---|
| C08K 3/01 | (2018.01) | |
| C08K 3/32 | (2006.01) | |
| C23C 18/14 | (2006.01) | |
| C08K 3/30 | (2006.01) | |
| C08K 5/00 | (2006.01) | |
| C23C 18/16 | (2006.01) | |
| C25D 5/56 | (2006.01) | |
| G03F 7/20 | (2006.01) | |
| H05K 1/03 | (2006.01) | |
| H05K 3/10 | (2006.01) | |

(52) U.S. Cl.
CPC .................. *C08K 3/01* (2018.01); *C08K 3/30* (2013.01); *C08K 3/32* (2013.01); *C08K 5/0008* (2013.01); *C23C 18/1612* (2013.01); *C25D 5/56* (2013.01); *G03F 7/2053* (2013.01); *H05K 1/0373* (2013.01); *H05K 3/105* (2013.01)

(58) Field of Classification Search
CPC  C08K 2003/321; C08K 3/01; C23C 18/1612; C23C 18/1868; C23C 18/204; H05K 2203/107
See application file for complete search history.

(56) References Cited

U.S. PATENT DOCUMENTS

| | | |
|---|---|---|
| 5,063,011 A | 11/1991 | Rutz et al. |
| 5,489,639 A | 2/1996 | Faber et al. |
| 8,759,409 B2 | 6/2014 | Kümmet et al. |
| 10,793,437 B2 | 10/2020 | Adolf et al. |
| 10,837,114 B2 | 11/2020 | Kim et al. |
| 2002/0039552 A1 | 4/2002 | Sapieszko et al. |
| 2002/0140137 A1 | 10/2002 | Sapieszko et al. |
| 2007/0155881 A1 | 7/2007 | Hirthe et al. |
| 2008/0241492 A1 | 10/2008 | Demartin Maeder et al. |
| 2009/0292051 A1* | 11/2009 | Li .......................... H05K 3/185 524/404 |
| 2010/0069650 A1 | 3/2010 | Hibst et al. |
| 2010/0105926 A1 | 4/2010 | Hibst et al. |
| 2010/0105927 A1 | 4/2010 | Hibst et al. |
| 2010/0140571 A1* | 6/2010 | Scheuer ............... C08K 5/0041 252/586 |
| 2012/0010345 A1* | 1/2012 | Edler .................... C09C 1/3669 524/403 |
| 2012/0058039 A1 | 3/2012 | Huang |
| 2013/0065979 A1 | 3/2013 | Kümmet et al. |
| 2013/0168133 A1* | 7/2013 | Schrauwen ............ H05K 13/00 174/250 |
| 2013/0214460 A1 | 8/2013 | Rogers et al. |
| 2014/0248564 A1* | 9/2014 | Schrauwen ............ H05K 3/185 430/319 |

(Continued)

FOREIGN PATENT DOCUMENTS

| | | |
|---|---|---|
| CN | 1886450 A | 12/2006 |
| CN | 101316906 A | 12/2008 |

(Continued)

OTHER PUBLICATIONS

Office Action dated Mar. 23, 2020 for JP 2019-553906.

(Continued)

*Primary Examiner* — Karuna P Reddy
(74) *Attorney, Agent, or Firm* — Faegre Drinker Biddle & Reath LLP

(57) ABSTRACT

A method for manufacturing electrically conductive structures, preferably conductive pathway structures using laser beams on a non-conductive carrier (LDS method), wherein a non-conductive carrier material is provided which contains at least one inorganic metal phosphate compound and at least one stabiliser finely distributed or dissolved therein, the carrier material is irradiated in regions by laser beams generating the electrically conductive structures in the irradiated regions.

9 Claims, 4 Drawing Sheets

(56) References Cited

U.S. PATENT DOCUMENTS

| | | |
|---|---|---|
| 2014/0360240 A1 | 12/2014 | Wissing et al. |
| 2015/0175804 A1 | 6/2015 | Aepli |
| 2015/0291778 A1* | 10/2015 | Musick .................. C09C 3/063 |
| | | 524/407 |
| 2016/0280544 A1 | 9/2016 | Wissemborski et al. |
| 2016/0340508 A1 | 11/2016 | Kim et al. |
| 2017/0002193 A1 | 1/2017 | Cheng et al. |
| 2017/0275764 A1 | 9/2017 | Kim et al. |
| 2017/0361584 A1* | 12/2017 | Feng ...................... H05K 3/185 |
| 2020/0095127 A1 | 3/2020 | Adolf et al. |
| 2020/0103565 A1* | 4/2020 | Wissemborski ....... G02B 5/003 |

FOREIGN PATENT DOCUMENTS

| | | |
|---|---|---|
| CN | 101501140 A | 8/2009 |
| CN | 101659406 B | 5/2011 |
| CN | 103167945 A | 6/2013 |
| CN | 104151923 A | 11/2014 |
| CN | 104725837 A | 6/2015 |
| CN | 105492214 A | 4/2016 |
| CN | 105793196 A | 7/2016 |
| CN | 104387738 B | 8/2016 |
| CN | 105899592 A | 8/2016 |
| CN | 105899609 A | 8/2016 |
| DE | 39 17 294 A1 | 11/1990 |
| DE | 100 53 639 A1 | 5/2002 |
| DE | 10 2006 038 043 A1 | 2/2008 |
| DE | 10 2009 001 335 A1 | 9/2010 |
| DE | 102010003366 A1 | 9/2011 |
| DE | 10 2013 100 583 A1 | 7/2014 |
| EP | 0 917 597 B1 | 1/2003 |
| EP | 1 191 127 B1 | 10/2004 |
| EP | 1 274 288 B1 | 3/2005 |
| EP | 1790701 A1 | 5/2007 |
| EP | 2 079 122 A1 | 7/2009 |
| JP | 2010-521400 A | 6/2010 |
| JP | 2010-521402 A | 6/2010 |
| JP | 2010-524809 A | 7/2010 |
| JP | 2015-120908 A | 7/2015 |
| JP | 2017-48377 A | 3/2017 |
| JP | 2017-508009 A | 3/2017 |
| KR | 10-2016-0047931 A | 5/2016 |
| WO | WO-98/31630 A1 | 7/1998 |
| WO | WO-2005/052049 A1 | 6/2005 |
| WO | WO-2010/076265 A2 | 7/2010 |
| WO | WO-2012/055742 A2 | 5/2012 |
| WO | WO-2014/111403 A1 | 7/2014 |
| WO | WO 2014/203227 A2 | 12/2014 |
| WO | WO-2015/067545 A1 | 5/2015 |
| WO | 2016/034001 A1 | 3/2016 |
| WO | WO-2016/064192 A1 | 4/2016 |
| WO | WO-2016/189023 A1 | 12/2016 |
| WO | WO-2018/178022 A1 | 10/2018 |

OTHER PUBLICATIONS

Office Action dated Jan. 7, 2021 for Chinese patent application No. 201880023260.7.

German Search Report dated Aug. 31, 2017 for DE 10 2017 106 913.5.

Office Action dated Apr. 2, 2021 for Chinese patent application No. 201880023247.1.

Lyakhov N.Z. "Polucheniye metallicheskikh nanoporoshkov vosstanovlenjiyem v organicheskikh zhidkostyakh", Khimia v interesakh ustojchivogo razvitia, 22, 2014, pp. 409-416.

Office Action dated Jun. 5, 2020 for Eurasian patent application No. 201992301.

Chaiyasith, Pachernchaipa, et al., "A Simple Route to Synthesize Ferromagnetic Binary Calcium Iron Pyrophosphate $CaFeP_2O_7$ Using Aqueous-Acetone Media," Advanced Materials Research, vol. 717, 2013, pp. 44-48.

Swider, J. et al., "A novel concept for the synthesis of nanometric LiFePo4 by co-precipitation method in an anhydrous environment," Procedia Engineering, 98 (2014), pp. 36-41.

International Preliminary Report on Patentability dated May 3, 2019 for PCT/EP2018/057660.

German Search Report dated Nov. 7, 2017 for DE 10 2017 106 912.7.

Priority document for WO2018178022, DE102017106913.5, with machine translation. Printed Jan. 23, 2020. (Year: 2020).

Sitzia, Rita, "Infrared spectra of some natural phosphates," Rendiconti Del Seminario Della Facolta Di Scienze Dell 'Universita Di Cagliari, Bd. 36, Nr. 1-2, Jan. 1, 1966, Seiten 105-115.

German Search Report dated Aug. 30, 2017 for DE 10 2017 106 911.9.

U.S. Appl. No. 16/498,481, filed Sep. 27, 2019.

U.S. Appl. No. 16/498,645, filed Sep. 27, 2019.

Office Action dated Jul. 7, 2021 for Taiwanese patent application No. 107109229.

Office Action dated Aug. 4, 2021 for Chinese patent application No. 201880023260.7.

Office Action dated Jan. 21, 2022 in U.S. Appl. No. 16/498,481 with double-patenting rejections on pp. 10-12.

Office Action dated Dec. 7, 2021 for Japanese patent application No. 2019-553862.

Office Action dated Dec. 22, 2021 for Chinese patent application No. 201880023260.7.

KR Office Action dated Sep. 6, 2022 for KR Application No. 10-2019-7027698.

* cited by examiner

METHOD FOR MANUFACTURING ELECTRICALLY CONDUCTIVE STRUCTURES ON A CARRIER MATERIAL

CROSS REFERENCE TO RELATED APPLICATIONS

This application is a National Stage of International Application No. PCT/EP2018/057662 filed Mar. 26, 2018, which claims benefit of German Patent Application No. 10 2017 106 913.5 filed Mar. 30, 2017, both of which are herein incorporated by reference in their entirety.

SUBJECT MATTER OF THE INVENTION

The present invention relates to a method for manufacturing electrically conductive metal structures, preferably conductive pathway structures using laser beams on a non-conductive carrier material as well as using a combination of at least one inorganic metal phosphate compound and a stabiliser in such a method.

BACKGROUND OF THE INVENTION

A large number of different methods for fine-structuring metallisation of surfaces is known from the literature. Such methods are used, for example when manufacturing injection moulded circuit carriers or moulded interconnect devices (MID). When applying electrically conductive metal structures, in particular conductive pathway structures, on a carrier material, there is a distinction made between additive techniques and subtractive techniques. In the case of an additive technique, the conductive metal, generally copper, is applied only on the required points such as conductor paths, solder pads, etc. In the case of a subtractive technique, however, the entire surface of the carrier material is coated with the conductive metal and then an etch resist is applied. The etch resist is in this case either already structurally applied, for example by means of screen printing or is completely applied and then e.g. structurally removed by irradiating using laser beams. The conductive metal loosened underneath, which is not covered by the etch resist, is etched away such that the desired conductive pathway structures remain. In the case of known additive techniques, all regions that are not supposed to be metallised are initially covered by screen printing or photo masking, an adhesion and activation layer is then applied on the uncovered regions and coppering is then carried out without an externally applied current.

A more modern additive method for manufacturing conductive pathway structures, which is widely used due to its advantageous properties, is laser direct structuring (laser direct structuring; LDS). The method includes the application or introduction of non-conductive metal complexes or metal salts, which release metallisation nuclei during laser irradiation, on or in a thermoplastic dielectric and subsequent irradiation of the desired structures using laser beams to initiate the metal nucleation. Fine, adhering conductive pathway structures can be obtained following subsequent chemical metallisation. However, the metal complexes described in the prior art for this purpose often have low stability in the processing operations for manufacturing the thermoplastic carrier materials, such as e.g. extrusion of injection moulding which leads to deposits on the metal surfaces of processing tools. The use of mainly heavy metal-containing complexes is also accompanied, in most cases, with ecological and toxicological concerns. The complexes used can also lead to undesired secondary reactions in the materials used, such as for example plastic degradation or they have a strong inherent colouring, whereby the carrier material obtains undesired colouring.

EP 0 917 597 B1 relates, for example, to a method for manufacturing conductive pathway structures in which a non-conductive organic heavy metal complex, in particular a Pd-containing heavy metal complex is applied as the coating on a non-conductive carrier material. This component is broken up in the region of the conductive pathway structures to be generated by UV radiation with the release of heavy metal nuclei and are subsequently chemically reductively metallised. The carrier material for this method must have either per sea microporous structure or the heavy metal component must be fixed with the aid of a binder on the carrier material. An advantage of the method is that in the course of the UV irradiation, no ablative particles occur, which is why no additional cleaning step is required following the irradiation. What is disadvantageous, however, is the thermally-limited stability of the organic component of the heavy metal complex as well as the use of heavy metals for ecological and toxicological reasons. The heavy metal complexes are also applied on the surface of the porous carrier material as a solution in mainly highly-polar solvents which results in a long drying process of generally more than 10 hours which is then followed by the laser structuring. In addition, the solvents used, in the case of a Pd-containing heavy metal complex for example dimethylformamide, are also disadvantageous from toxicological and ecological viewpoints.

EP 1 191 127 B1 discloses a method for selective metallisation of dielectric materials, in which the dielectric is covered with an activation layer of conductive material using adhesive and a structuring is obtained by way of laser irradiation without a mask. This is then electrolytically or currentlessly metallised. Conductive polymers, metal sulphides or metal polysulphides covered with Pd or Cu nuclei are used as conductive materials. Major disadvantages of this method are the proportionally high costs of the electrically conductive materials, such as the conductive polymers as well as the toxicological and ecological issue of heavy metal compounds. These can also lead to undesired degradation and secondary reactions in the dielectric. This very complex method also requires a number of preparation steps, for example conditioning, catalyst fixing, removing, etc., using chemicals that are complex to handle, $KMnO_4$, $H_2O_2$, $H_2SO_4$, $H_3BO_3$.

EP 1 274 288 B1 discloses a method which, as the nucleus-forming component, uses non-conductive, thermally highly-stable complexes of heavy metals of d- and f-blocks which can remain unchanged on the surface of the carrier material even after the laser structuring in the vicinity of the conductive pathway structure. These are stable even after exposure to the solder temperatures and in the acid or alkaline metallisation baths used for metallisation. Major disadvantages of this method are the high costs of the transition metal compounds and their toxicological and ecological issue as well as possible secondary reactions due to the transition metal compounds during the course of the processing operation.

OBJECT

The object of the present invention was to provide a method for manufacturing electrically conductive metal structures, preferably conductive pathway structures, on a non-conductive carrier material that is improved with respect to the prior art and which in particular avoids or at least reduces the use of heavy metal complexes and thus is less concerning for toxicological and ecological reasons than the known methods, causes little or no deposits on the processing tools and is comparatively simple and cost-effective.

DESCRIPTION OF THE INVENTION

This object is achieved according to the invention by a method for manufacturing electrically conductive structures, preferably conductive pathway structures using laser beams on a non-conductive carrier material (LDS method), characterised in that a non-conductive carrier material is provided which contains at least one inorganic metal phosphate compound and at least one stabiliser finely distributed or dissolved therein, the carrier material is irradiated in regions by means of laser beams generating the electrically conductive structures in the irradiated regions, wherein the at least one inorganic metal phosphate compound is selected from the group, consisting of copper hydroxide phosphate of the general formula $Cu_2(OH)PO_4$, crystal water-free iron(II) orthophosphate of the general formula $Fe_3(PO_4)_2$ or crystal water-free iron(II) metal orthophosphate, iron(II) metal phosphonate, iron(II) metal pyrophosphate or iron(II) metal metaphosphate of the general formula $Fe_aMet_b(PO_c)_d$, where a is a number from 1 to 5, b is a number from >0 to 5, c is a number from 2.5 to 5, d is a number from 0.5 to 3 and wherein Met represents one or more metals selected from the group consisting of Li, Na, K, Rb, Cs, Mg, Ca, Sr, Ba, the transition metals (d block), in particular Sc, Y, La, Ti, Zr, Hf, Nb, Ta, Cr, Mo, W, Mn, Cu, Zn, Co, Ni, Ag, Au, the metals and semimetals of the third, fourth and fifth main groups, in particular B, Al, Ga, In, Si, Sn, Sb, Bi and the lanthanoids or combinations of the above mentioned phosphates, wherein the at least one stabiliser is selected from compounds of the group, consisting of Brnsted acids and Lewis acids, wherein a Brnsted acid is defined as a proton-transferring compound and a Lewis acid is defined as a non-proton-transferring electron-deficient compound.

The electrically conductive structures generated using laser irradiation may be an elementary metal, an electrically conductive metal oxide, an electrically conductive carbon, an electrically conductive carbon compound or a combination of the foregoing.

It has been surprisingly found that by using the stabiliser according to the invention in combination with the at least one inorganic metal phosphate compound particularly favourable reaction conditions are achieved for generating electrically conductive structures with laser exposure. It was also determined that the stabiliser prevents or at least reduces decomposition reactions due to thermal and mechanical effect which can lead to metal deposits on the processing devices (extrusion screws, injection moulding case, etc.) in the course of processing.

The term Brnsted acid denotes, in the sense of the present invention, a compound which acts as a proton donor and can transfer protons to a second reaction partner, the so-called Brnsted base. In this case, the Brnsted acid is defined as the compound whose $pK_s$ value is less than that of the reaction partner. In the context according to the invention, the $pK_s$ value of the Brnsted acid is less than the $pK_s$ value of the water which is 14.

The term Lewis acid denotes, in the sense of the present invention, a compound which acts as an electrophilic electron pair acceptor and thus partially or completely receives an electron pair forming an adduct from a second reaction partner, the so-called Lewis base. In the sense of the present invention, Lewis acids include compounds i) with an incomplete electron octet such as: $B(CH_3)_3$, $BF_3$, $AlCl_3$, $FeCl_2$, ii) metal cations as central atoms in chemical complexes, iii) molecules with polarised multiple bonds, iv) halides with unsaturated coordination, such as for example $SiCl_4$ or $PF_5$, v) other electron pair acceptors, for example condensed phosphates.

A carrier material in the sense of the present invention may comprise any organic or inorganic material which can contain the combination of metal phosphate compound and stabiliser of the method according to the invention finely distributed or dissolved. The metal phosphate compound and stabiliser can be distributed homogeneously in the carrier material in one embodiment of the invention. This has advantages in terms of manufacturing since a homogeneous distribution can be very easily implemented with the aid of conventional processing methods such as melting, extrusion, extrusion pressing, etc. In one of the further embodiments of the invention, the metal phosphate compounds and the stabiliser are more highly concentrated in certain regions of the carrier material than in other regions. In one embodiment, the metal phosphate compound and the stabiliser at the surface of the carrier material, on which the metal structures are generated, are more highly concentrated up to a certain penetration depth of preferably 10 μm to 5 mm, further preferably of 50 μm to 3 mm, particularly preferably of 100 μm to 1 mm, than in regions lying deeper. A targeted enrichment in the near-surface region of the carrier material can lead to improved material properties as well as to improved conductive pathway structures since the metal phosphate compound is required precisely there to generate the electrically conductive structures. In addition, the generation of electrically conductive material in deeper regions in the interior of the carrier material is reduced or completely prevented and as a result disadvantageously influences the structural integrity of the carrier material to a lesser extent.

The inorganic metal phosphate compounds of the method according to the invention used are temperature resistant such that they remain stable in the processing operation and under exposure to solder temperatures which are used when processing conductive pathway structures, which means in this context that they are not electrically conductive at increased temperature and do not decompose. They remain unchanged in the carrier material and in the vicinity of the conductive pathways during the manufacturing process of the conductive structures and even thereafter. An additional method step to remove these compounds is not necessary.

In a preferred embodiment of the invention, the at least one metal phosphate compound used is or comprises crystal water-free iron(II) orthophosphate of the general formula $Fe_aMet_b(PO_c)_d$, and/or crystal water-free iron(II) metal orthophosphate, iron(II) metal phosphonate, iron(II) metal pyrophosphate or iron(II) metal metaphosphate of the general formula $Fe_aMet_b(PO_c)_d$. These iron compounds provide a number of advantages with respect to metal compounds used hitherto in known LDS methods. They can be manufactured more economically and cost-effectively which advantageously affects the manufacturing costs of carrier materials with electrically conductive structures, in particular circuit boards in accordance with the method according to the invention. Furthermore, they have high levels of absorption in the NIR range but only weak levels of absorption in the visible range of electromagnetic radiation. As a result, the colour of the carrier material is not notably influenced, while it can, at the same time, be efficiently activated by means laser beams in the NIR range. It is assumed that the high absorption capacity in the NIR range is caused by the crystal structure of the compounds according to the invention. A particularly high utilisation of the irradiated laser beams is achieved in relation to the mass of metal phosphate compound used. These properties allow the proportions of these (and also of other) aggregates, which are added to the carrier material, to be kept low in order to keep associated disadvantageous effects on the material properties of the carrier material as low as possible.

The Brnsted acids and/or Lewis acids used according to the invention as stabilisers are expediently selected from such acids which are temperature resistant such that they remain stable in the processing operation and after exposure to the solder temperatures and do not decompose under these and other conditions used.

Brnsted acids, which are suitable and preferred as stabilisers according to the invention, comprise oxoacids of phosphorous with phosphorous in the oxidation stage +V, +IV, +III, +II or +I, sulphuric acid, nitric acid, hydrofluoric acid, silicic acid, aliphatic and aromatic carboxylic acids and salts of the aforementioned acids. The oxoacids of phosphorous and their salts are preferably selected from phosphoric acid, diphosphoric acid, polyphosphoric acids, hypodiphosphoric acid, phosphonic acid, diphosphonic acid, hypodiphosphonic acid, phosphinic acid and salts of the aforementioned acids. The aliphatic and aromatic carboxylic acids and their salts are preferably selected from acetic acid, formic acid, oxalic acid, phthalic acid, sulfonic acids, benzoic acid and salts of the aforementioned acids. Acids that can be easily mixed with the carrier material, do not decompose during incorporation of the stabiliser into the carrier material and do not or only slightly influence the material properties are advantageous.

Lewis acids, which are suitable and preferred as stabilisers according to the invention comprise sodium aluminium sulphate (SAS), monocalcium phosphate monohydrate (MCPM), dicalcium phosphate dihydrate (DCPD), sodium aluminium phosphate (SALP), calcium magnesium aluminium phosphate, calcium polyphosphate, aluminium chloride, boron trifluoride, magnesium polyphosphate, aluminium hydroxide, boric acid, alkyl boranes, aluminium alkyls, iron(II) salts and mixtures of the foregoing. Lewis acids have the advantage with respect to Brnsted acids, whereby they do not separate and release water during the processing and structuring process which could lead to foaming, crack formation or ablation of the carrier material or to oxidation reactions of the metal phosphate compound.

In one embodiment of the invention, the stabiliser comprises a combination of at least one Brnsted acid and at least one Lewis acid. Such a combination has the advantage of advantageous conditions for the generation of electrically conductive structures and increased stability of the metal phosphate compound being very easily achievable in the processing step due to the generally very high stability of the diversely available Brnsted acids. At the same time, by adding the at least one Lewis acid any water possibly being released, which could negatively influence the result of the laser structuring, can be collected.

The method according to the invention provides the advantage with respect to the known methods according to the prior art of good conductive structures being obtainable even without additional chemically reductively or electrolytically metal deposition. The manufacture of carrier materials with electrically conductive structures can be significantly simplified and carried out more cost-effectively. Individual conductive pathways structures can also be manufactured very quickly and economically on complex carrier materials. The method according to the invention also opens up very flexible production possibilities and changes of the generated conductive pathway structures, since masks, such as screen printing masks or photomasks are not required and additional metallisation steps can be omitted depending on the requirements. The use of resist materials can also be dispensed with whereby additional chemicals and process steps can be significantly economised. Complex and difficult to manage etching and strip steps are not required. The reject rate with laser structuring according to the invention is low compared to other methods whereby significant costs can be saved.

In a further embodiment of the method according to the invention, metal is chemically reductively or electrolytically separated on the electrically conductive structures generated by means of laser beams. The electric conductivity of the structures can be hereby further increased. The chemically reductive metallisation can be advantageously carried out wet-chemically in a metal bath, preferably in a copper, nickel, silver or gold bath, particularly preferably in a copper bath. Corresponding techniques and methods for this purpose are known to the person skilled in the art in this field. The chemically reductive metallisation has the advantage over electrolytic metallisation that in this method the often-required auxiliary conductors, which serve as current bridges between isolated conductor pathway regions, are not required and, unlike in the case of electrolytic metallisation, do not subsequently have to be removed once again in a further process step, for example by laser treatment.

The carrier material with the electrically conductive structures generated thereon is suitable for example for use as circuit boards for electric circuits. The electrically conductive structures can also be designed as antenna structures which can be used as antennae for electromagnetic radiation, for example in mobile radio devices. In both cases, the electrically conductive structures generated can be used with or without additional chemically reductive or electrolytic metal deposition.

In a preferred embodiment of the invention, the non-conductive carrier material contains the at least one inorganic metal phosphate compound in a quantity of 0.01% by weight to 45% by weight, preferably in a quantity of 0.1% by weight to 20% by weight, particularly preferably in a quantity of 1% by weight to 10% by weight in relation to the total mass of the composition made up of the sum of the mass of the non-conductive carrier material and the added material. An excessively low proportion ensures an excessively low density of metal phosphate compound whereby poorly formed conductor pathways may develop, whereas an excessively high proportion of metal phosphate compound can lead to impairment of the material properties of the non-conductive carrier material.

In a further preferred embodiment of the invention, the non-conductive carrier material contains the at least one stabiliser in a quantity of 0.01% by weight to 25% by weight, preferably in a quantity of 0.1% by weight to 20% by weight, particularly preferably in a quantity of 1% by weight to 10% by weight in relation to the total mass of the composition made up of the sum of the mass of the non-conductive carrier material and the added material. An excessively low proportion ensures an excessively low density of stabiliser whereby the positive effect of the stabiliser in relation to the formation of the conductor structures in the laser structuring operation and the stability in the processing operation can be reduced, whereas an excessively high proportion of stabiliser can lead to impairment of the material properties of the non-conductive carrier material.

In a further embodiment of the invention, the non-conductive carrier material also contains at least one synergist which is selected from metal phosphates, metal oxides or mixtures thereof. The metal atoms of the metal phosphates, metal oxides or mixtures thereof are preferably selected from the group consisting Cu, Au, Ag, Pd, Pt, Fe, Zn, Sn, Ti, Al. It was surprisingly found that the synergist supports the process of the metal complex decomposition and the metal deposition on the surface of the carrier material. According to the invention, suitable synergists are particularly preferably selected from the group consisting of copper phosphate, tricopper diphosphate, copper pyrophosphate, tin phosphate, zinc phosphate, titanium oxide, zinc oxide, tin oxide and iron oxide. The synergists used are expediently selected with respect to their temperature resistance such that they remain stable in the processing operation and after exposure to the solder temperatures and do not decompose in the baths used for metallisation which may be carried out.

The non-conductive carrier material expediently contains the at least one synergist in a quantity of 0.01% by weight to 15% by weight, preferably in a quantity of 0.1% by weight to 10% by weight, particularly preferably in a quantity of 1% by weight to 5% by weight in relation to the total mass of the composition made up of the sum of the mass of the non-conductive carrier material and the added material. An excessively low proportion ensures an excessively low density of synergist whereby the positive effect of the synergist in relation to the formation of the conductor structures in the laser structuring operation can be reduced, whereas an excessively high proportion of synergist can lead to impairment of the material properties of the non-conductive carrier material.

The person skilled in the art can determine suitable quantities and a suitable ratio of metal phosphate compound, stabiliser and possibly synergist for a given carrier material with the knowledge of the invention through simple tests and they are dependent, inter alia, on the carrier material used and the desired conductor pathway structuring taking into account the method conditions to be applied and the laser to be used.

The non-conductive carrier material according to the invention is expediently selected from the group consisting of thermoplastic plastics, thermosetting plastics, elastomers, glasses, ceramics, natural or synthetic varnishes, natural or synthetic resins, silicones or combinations or mixtures thereof. The non-conductive carrier material is preferably a thermoplastic or a thermosetting polymer. The non-conductive carrier material is selected from the group consisting of polyvinyl butyral (PVB), polypropylene (PP), polyethylene (PE), polyamide (PA), polyesters such as polybutylene terephthalate (PBT), polyethylene terephthalate (PET), polyphenylene oxide, polyacetal, polymethacrylate, polyoxymethylene, polyvinyl acetal, polystyrene, acryl butadien styrene (ABS), acrylonitrile styrene acrylate (ASA), polycarbonate, polyethersulfone, polysulfonate, polytetrafluoroethylene, polyurea, formaldehyde resin, melamine resin, polyetherketone, polyvinyl chloride, polylactide, polysiloxane, phenol resin, epoxide resin, poly(imide), bismaleimide-triazine, thermoplastic polyurethane, copolymers and/or mixtures of the polymers mentioned above, e.g. PC/ABS copolymers.

The non-conductive carrier material can contain additional additives or aggregates, for example fillers, such as silicic acid and/or its derivatives, fire retardants, glass fibres, process excipients, colour pigments etc., wherein these aggregates should be selected such that they do not, as far as possible, disadvantageously influence the material properties of the carrier material and the manufacture, according to the invention, of electrically conductive structures.

The introduction of metal phosphate compound, stabiliser and possibly synergist and possibly aggregates into a polymer carrier material can advantageously be carried out via a so-called master batch. A master batch in the sense of the present invention is a polymer matrix in the form of granulate or powder which contains the additional materials in concentrations that are greater than in the end application. The master batch or different master batches are combined, for manufacturing the carrier material according to the invention, with additional polymer material without the additional material contained in the master batch in such quantities or ratios which correspond to the desired concentrations of the additional materials in the end product. Master batches have the advantage over the addition of different materials in the form of pastes, powders or liquids in that they ensure high processability and are very easy to process and to dose.

If the non-conductive carrier material is a varnish, single-component varnishes (1K varnish) or two-component varnishes (2K varnish) are, for example, considered according to the invention. Single-component varnishes (1K varnishes) contain binder as a dispersion in aqueous solution or dissolved in organic solvent. In the case of two-component varnishes (2K varnishes), the binder consists of resin and hardening agents. They are stored separately and mixed with one another shortly before processing. They react chemically and harden (without drying). Some 2K varnishes do not contain any solvents. Binders comprise natural resins and oils (oil colours), plant components (Chinese varnish, Japanese varnish, egg (egg tempura), gum arabic (watercolour), lime (lime colour), glue (glue colour) tar or bitumen. According to the invention, suitable varnishes include oil varnishes, cellulose nitrate varnishes, alkyd resin varnishes, such as dispersions made of polyvinyl acetate, acrylic resin varnishes, such as polyacrylate varnishes and polymethacrylate varnishes, silicon resin varnishes, epoxy resin varnishes and polyurethane varnishes.

The laser beams for carrying out the method according to the invention can have a wavelength in the range of 200 nm to 12,000 nm. A wavelength in the region of 700 nm to 1500 nm is preferred, particularly preferably in the region of 850 nm to 1200 nm. Near-infrared lasers such as e.g. NdYag lasers, IR diode lasers, VCSEL lasers and excimer lasers are preferred. The use of excimer lasers as known from photolithography is suitable for this. Suitable excimer lasers are ArF, KrF, XeCl, XeF and KrCl lasers. The use of excimer lasers allows the formation of very sharp contours of the structures. The use of KrF excimer lasers with a wavelength of 248 nm is particularly advantageous, in particular when the carrier material is a thermoplastic polymer material. The laser allows the structuring without significant heating and at most with minimal melting of the material in the operative area of the laser. A very high limitation sharpness is also achieved.

The use of Nd:YAG lasers as known from medical technology is advantageous for this. Nd:YAG lasers with wavelengths of 1064 nm, 946 nm, 532 nm or 473 nm are particularly suitable, wherein an Nd:YAG laser with a wavelength of 1064 nm is particularly preferred since the laser structuring can be carried out in a careful manner therewith and less carbonisation or similar degradation reactions of the carrier material occur.

According to the invention, VCSEL lasers (vertical cavity surface emitting lasers) are also suitable. In this case, they are semiconductor lasers, especially vertical cavity surface emitting lasers with which the light is radiated perpendicular to the plane of the semiconductor chip, unlike conventional edge-emitters with which the light escapes at one or two flanks of the chip. Advantages of such vertical cavity surface emitting lasers are, on the one hand, the low manufacture costs and the low power consumption. On the other hand, the radiation profile with simultaneously low output is better with respect to edge-emitters. The VCSEL is characterised by being available in a single-mode and the wavelength being adjustable. This allows the suitable wavelength to be specifically selected, for example the wavelength at which the metal phosphate compound used according to the invention has the highest absorption or at which the disrupting effects of the laser radiation are kept particularly low. A very precise laser structuring result can be achieved according to the invention.

The invention also comprises the use of a combination of at least one inorganic metal phosphate compound and a stabiliser as well as possibly at least one synergist, as described and defined herein for manufacturing electrically conductive structures, preferably conductive pathway structures using laser beams, on a non-conductive carrier material.

The invention also comprises a carrier material with electrically conductive structures, preferably conductive pathway structures, on its surface, wherein the carrier material contains at least one inorganic metal phosphate compound and at least one stabiliser as well as possibly at least one synergist finely distributed or dissolved therein, as they are described and defined herein.

The invention will now be explained further based on exemplary embodiments as well as manufacturing examples for crystal water-free iron (II) orthophosphates of the general formula $Fe_3(PO_4)_2$ and crystal water-free iron(II) metal orthophosphate, iron(II) metal phosphonate, iron(II) metal pyrophosphate or iron (II) metal metaphosphate of the general formula $Fe_aMet_b(PO_c)_d$, which are suitable according to the invention as metal phosphate compounds. The attached figures show X-ray diffraction diagrams of the metal phosphate compounds manufactured according to the manufacturing examples.

EXAMPLES

X-Ray Diffractometry (XRD)

Of the products manufactured according to the examples below, x-ray diffraction measurements (XRD) are taken using a D8 Advance A25-type diffractometer (Bruker) and CuKα radiation.

The products and their crystal structures were identified on the basis of corresponding reference diffractograms (Powder Diffraction Files; PDF) from the ICDD (International Centre for Diffraction Data), previously JCPDS (Joint Committee on Powder Diffraction Standards) database. If no PDF cards were available for the products manufactured, PDF cards for isotype compounds were used (=compounds of the same structural type).

Elementary Analysis

Elementary analyses were carried out by means of x-ray fluorescence analysis (XRF) using an Axios FAST spectrometer (PANalytical) in order to determine and confirm the stoichiometries of the products manufactured.

Manufacturing Example 1—Crystal Water-Free $Fe_2P_2O_7$

Figure 1:
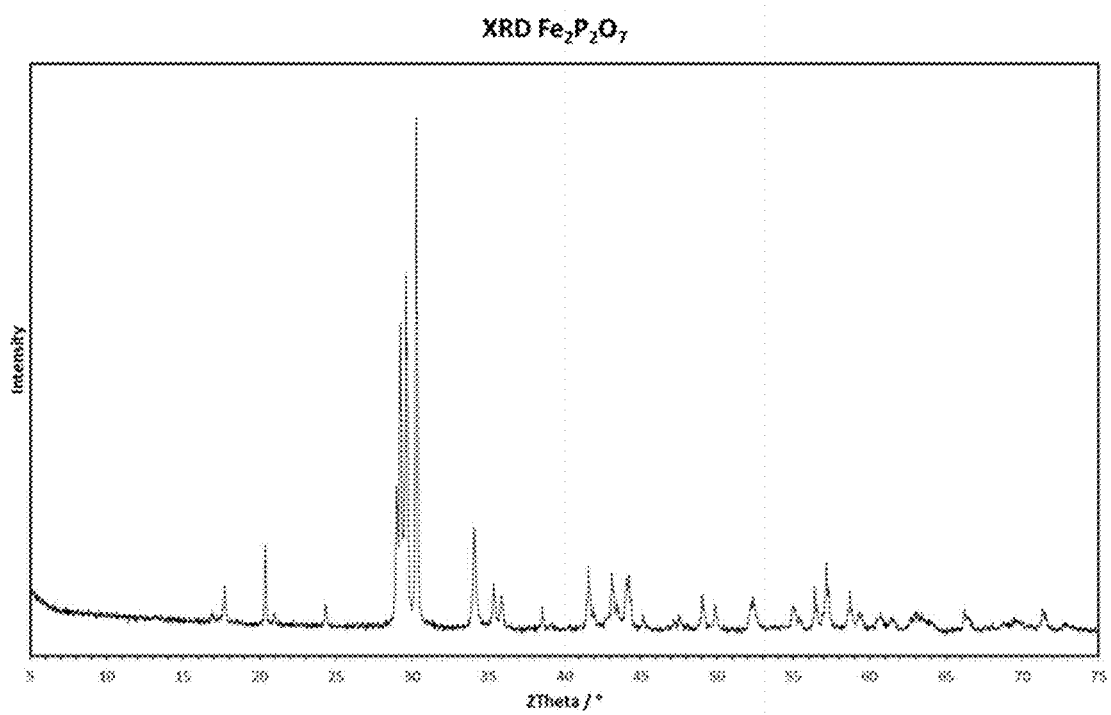
FIG. 1 shows the x-ray diffractogram of crystal water-free $Fe_2P_2O_7$ manufactured in accordance with the invention in line with manufacturing example 1.

A suspension of i) 35.5 kg iron(III) oxide-hydroxide [FeO(OH) or $Fe_2O_3$ $1H_2O$], ii) 16.5 kg 98% phosphonic acid [$H_3PO_3$], iii) 26.5 kg 75% phosphoric acid [$H_3PO_4$] and solvent 220 kg water was spray granulated. The granulate obtained in this way was temperature treated in a rotary kiln for an average residence time of 4 h in a forming gas atmosphere (5% by volume $H_2$ in $N_2$) at 700° C. An almost colourless to slightly pink product is obtained. The x-ray diffractogram (XRD) of the product is shown in FIG. 1. The product was identified using PDF card 01-072-1516.

Figure 2:
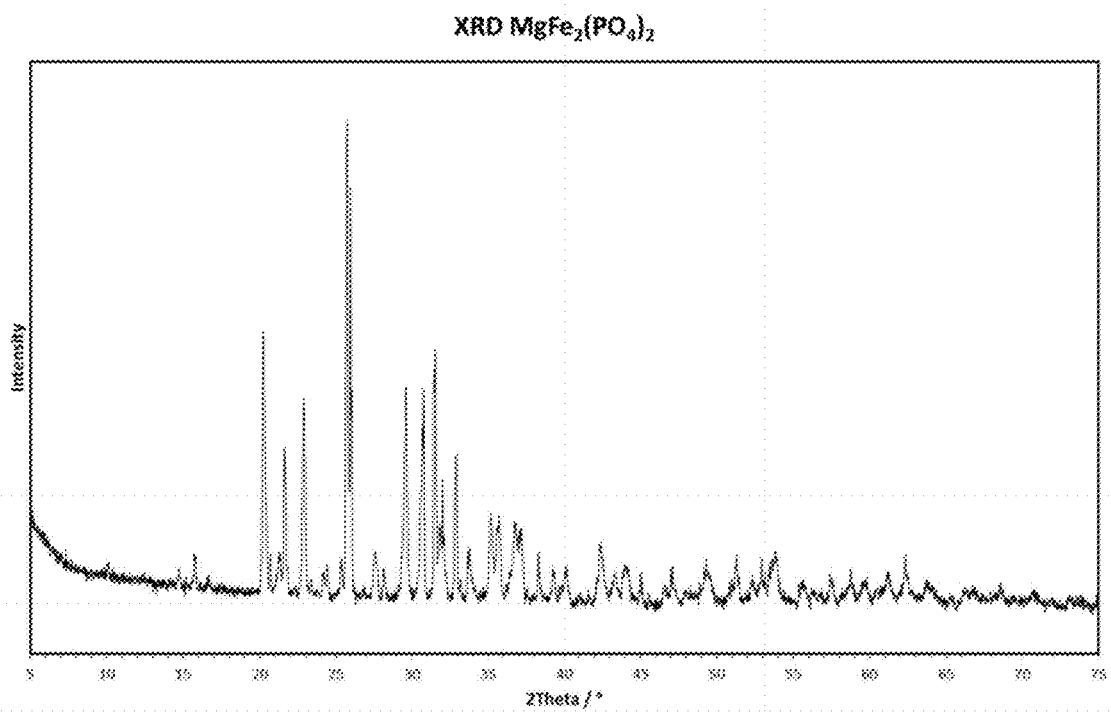
FIG. 2 shows the x-ray diffractogram of a phase mixture of crystal water-free $Mg_{1.5}Fe_{1.5}(PO_4)_2$ and $Fe_3(PO_4)_2$ manufactured in accordance with the invention in line with manufacturing example 2.

Manufacturing Example 2—Phase Mixture of Crystal Water-Free $Mg_{1.5}Fe_{1.5}(PO_4)_2$ and $Fe_3(PO_4)_2$ A suspension of i) 8.45 kg iron(III) oxide-hydroxide [FeO(OH) or $Fe_2O_3$ $1H_2O$], ii) 7.95 kg 98% phosphonic acid [$H_3PO_3$], iii) 19.6 kg iron(III) phosphate dihydrate [$FePO_4$ $2H_2O$], iv) 8.43 kg magnesium carbonate [$MgCO_3$] and solvent 160 kg water was spray granulated. The granulate obtained in this way was temperature treated in a rotary kiln for an average residence time of 3 h in a forming gas atmosphere (5% by volume $H_2$ in $N_2$) at 750° C. An almost colourless product is obtained. The x-ray diffractogram (XRD) of the product is shown in FIG. 2. The product was identified using the PDF cards as a phase mixture of a main phase $Mg_{1.5}Fe_{1.5}(PO_4)_2$ (PDF card 01-071-6793) and a subsidiary phase $Fe_3(PO_4)_2$ (PDF card 00-49-1087).

Manufacturing Example 3—Crystal Water-Free $Fe_3(PO_4)_2$

Figure 3:
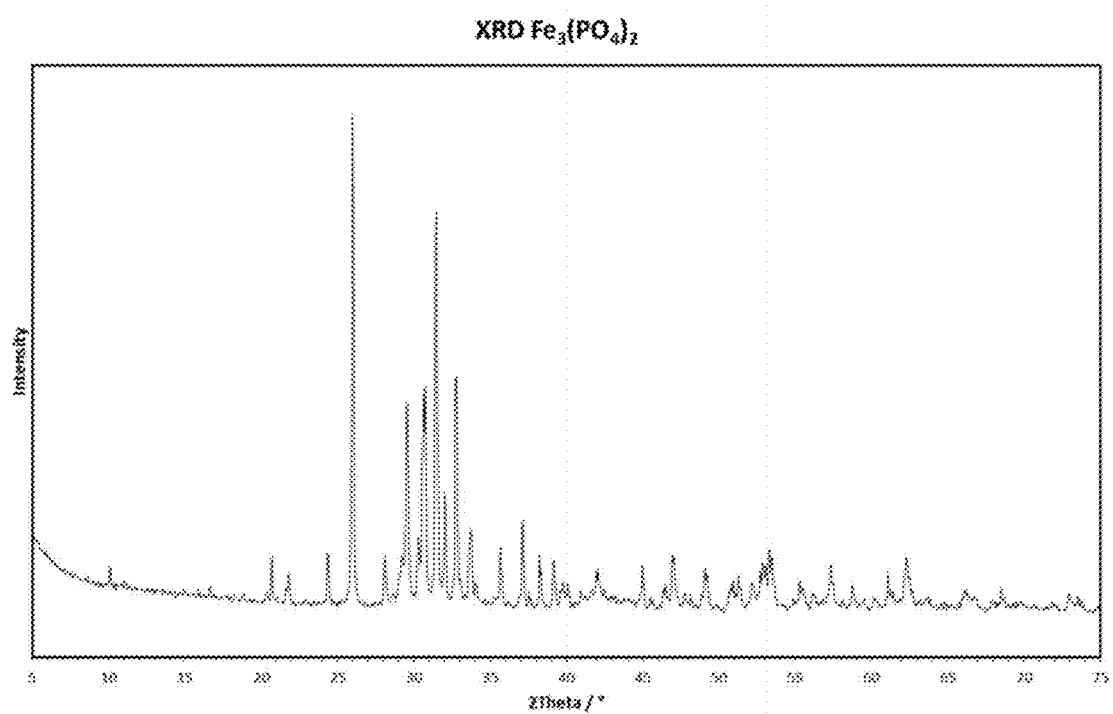
FIG. 3 shows the x-ray diffractogram of crystal water-free $Fe_3(PO_4)_2$ manufactured in accordance with the invention in line with manufacturing example 3.

A suspension of i) 21.75 kg iron(III) oxide-hydroxide [FeO(OH) or $Fe_2O_3$ $1H_2O$], ii) 12.15 kg 98% phosphonic acid [$H_3PO_3$], iii) 10.3 kg iron(III) phosphate dihydrate [$FePO_4$ $2H_2O$] and solvent: 140 kg water was spray granulated. The granulate obtained in this way was temperature treated in a rotary kiln for an average residence time of 90 minutes in a forming gas atmosphere (5% by volume $H_2$ in $N_2$) at 750° C. An almost colourless product is obtained. The x-ray diffractogram (XRD) of the product is shown in FIG. 3. The product crystallises in the graftonite structure and was identified using PDF card 00-49-1087. The product was ground such that 50% by weight of the product had a particle size of less than 3 μm. The particle size distribution of the ground product is shown in FIG. 9.

Manufacturing Example 4—Manufacture of Crystal Water-Free $KFe(PO_4)$

A suspension of i) 11.80 kg iron(III) oxide-hydroxide [FeO(OH) or $Fe_2O_3$ $1H_2O$], ii) 10.70 kg 98% phosphonic acid [$H_3PO_3$], iii) 24.8 kg iron(III) phosphate dihydrate [$FePO_4$ $2H_2O$]

IV) 29.8 kg 50% lye [KOH]

Figure 4:
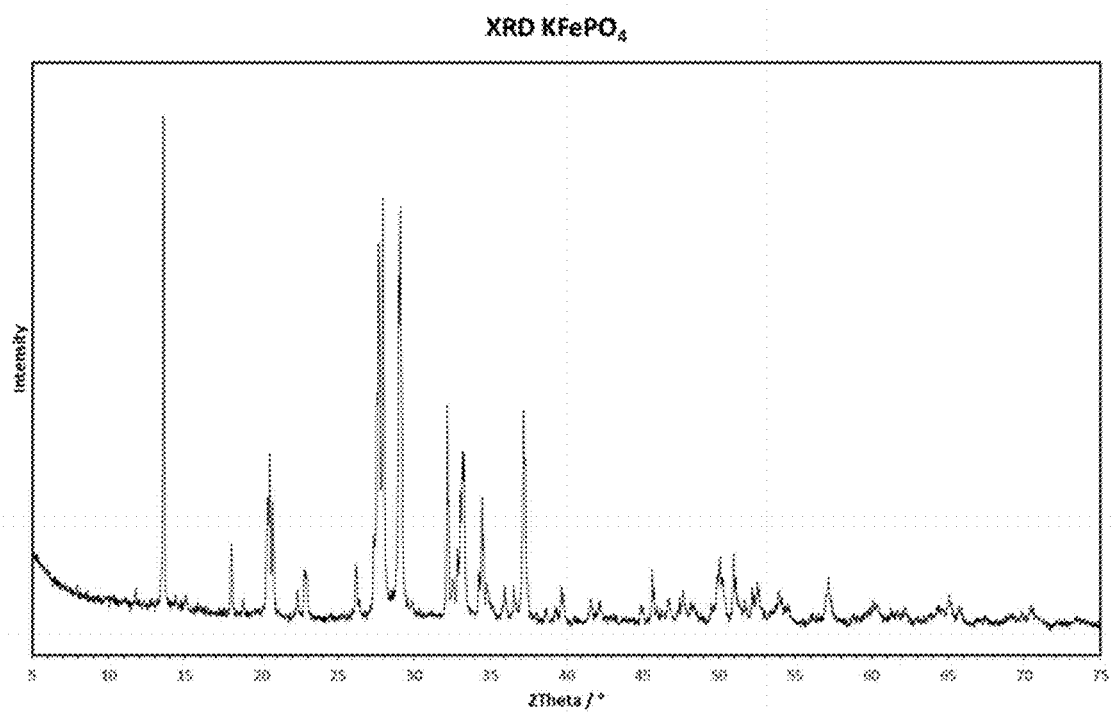
FIG. 4 shows the x-ray diffractogram of crystal water-free $KFe(PO_4)$ manufactured in accordance with the invention in line with manufacturing example 4.

V) 1.0 kg 75% phosphoric acid [$H_3PO_4$] and solvent: 110 kg water was spray granulated. The granulate obtained in this way was temperature treated in a rotary kiln for an average residence time of 3 h in a forming gas atmosphere (5% by volume $H_2$ in $N_2$) at 650° C. A pale light green product is obtained. The x-ray diffractogram (XRD) of the product is shown in FIG. 4. The product was identified using PDF card 01-076-4615.

Manufacturing Example 5—Crystal Water-Free $KFe_{0.90}Zn_{0.10}(PO_4)$

A suspension of i) 10.60 kg iron(III) oxide-hydroxide [FeO(OH) or $Fe_2O_3$ $1H_2O$], ii) 9.65 kg 98% phosphonic acid [$H_3PO_3$], iii) 22.30 kg iron(III) phosphate dihydrate [$FePO_4$ $2H_2O$]

IV) 2.15 kg zinc oxide [ZnO]

IV) 29.8 kg 5% lye [KOH]

Figure 5:
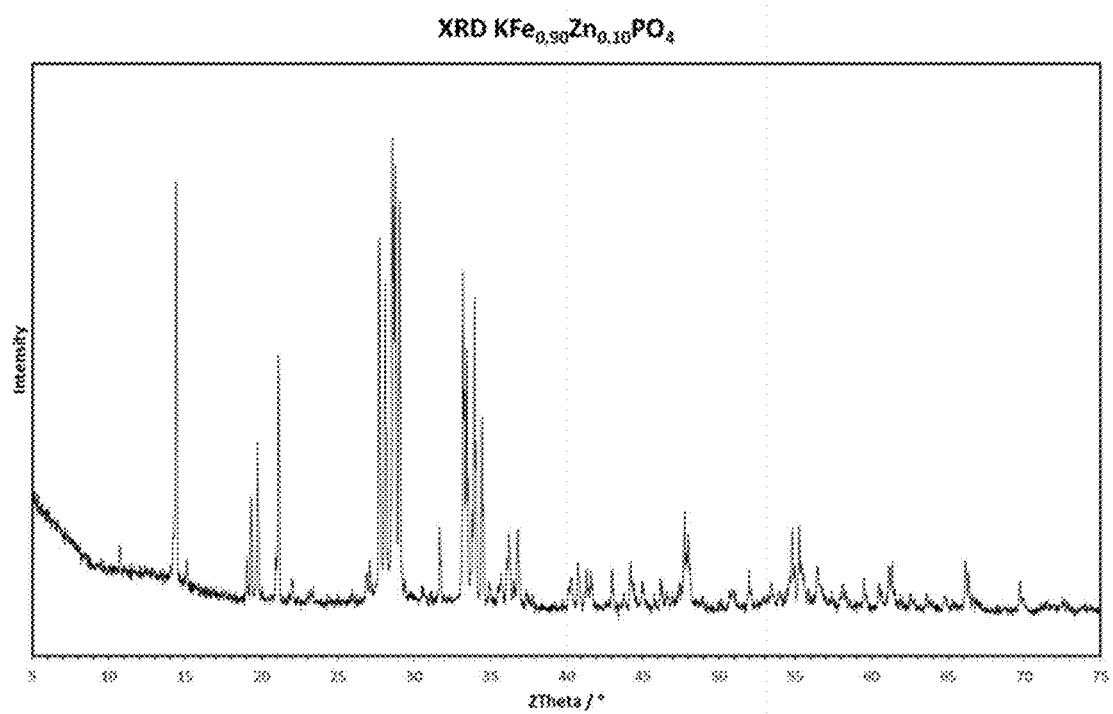
FIG. 5 shows the x-ray diffractogram of crystal water-free $KFe_{0.90}Zn_{0.10}(PO_4)$ manufactured in accordance with the invention in line with manufacturing example 5.

V) 4.15 kg 75% phosphoric acid [$H_3PO_4$] and solvent: 120 kg water was spray granulated. The granulate obtained in this way was temperature treated in a rotary kiln for an average residence time of 2 h in a forming gas atmosphere (5% by volume $H_2$ in $N_2$) at 600° C. A light grey product is obtained. The x-ray diffractogram (XRD) of the product is shown in FIG. 5. The product is a new structure type which appears to be closely linked to the $KFe(PO_4)$ structure according to PDF card 01-076-4615.

Manufacturing Example 6—Crystal Water-Free $KFe_{0.75}Zn_{0.25}(PO_4)$

A suspension of i) 8.85 kg iron(III) oxide-hydroxide [FeO(OH) or $Fe_2O_3$ $1H_2O$], ii) 8.05 kg 98% phosphonic acid [$H_3PO_3$], iii) 18.60 kg iron(III) phosphate dihydrate [$FePO_4$ $2H_2O$]

IV) 5.40 kg zinc oxide [ZnO]

IV) 29.8 kg 50% potash lye [KOH]

Figure 6:
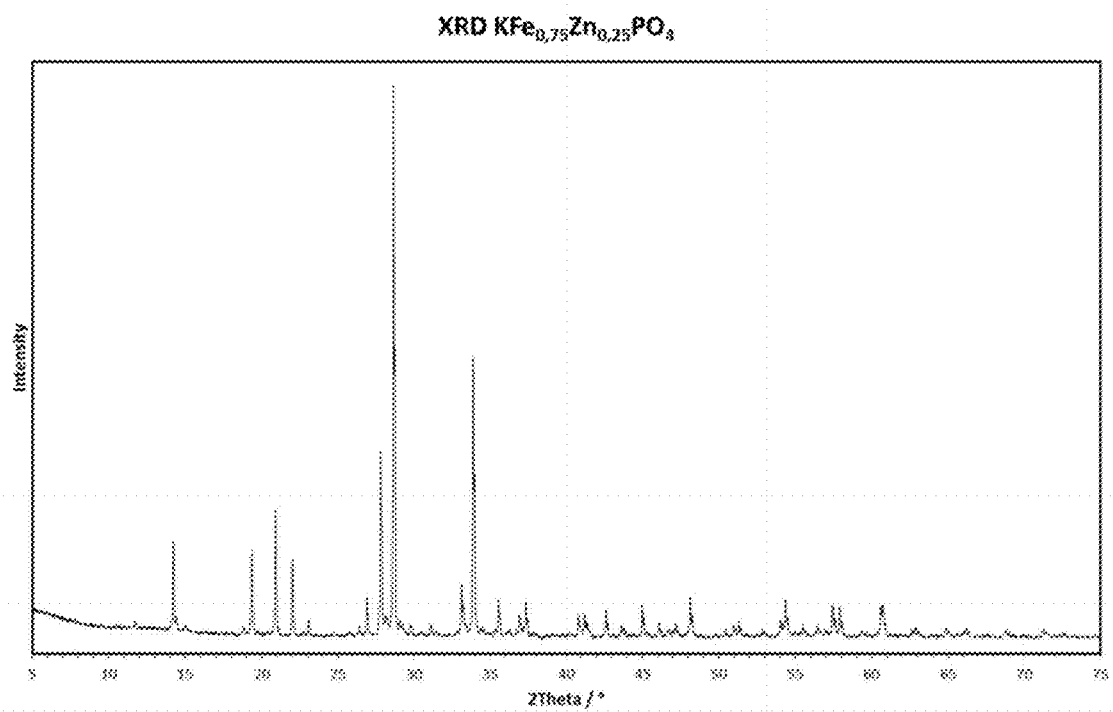
FIG. 6 shows the x-ray diffractogram of crystal water-free $KFe_{0.75}Zn_{0.25}(PO_4)$ manufactured in accordance with the invention in line with manufacturing example 6.

V) 9.30 kg 75% phosphoric acid [$H_3PO_4$] and solvent: 120 kg water was spray granulated. The granulate obtained in this way was temperature treated in a rotary kiln for an average residence time of 2 h in a forming gas atmosphere (5% by volume $H_2$ in $N_2$) at 600° C. A light grey product is obtained. The x-ray diffractogram (XRD) of the product is shown in FIG. 6. The product is not known from the literature. It crystallises in an isotype manner to form $KZn(PO_4)$ according to PDF card 01-081-1034.

Manufacturing Example 7—Crystal Water-Free $KFe_{0.75}Mn_{0.25}(PO_4)$

A suspension of i) 8.85 kg iron(III) oxide-hydroxide [FeO(OH) or $Fe_2O_3$ $1H_2O$], ii) 8.05 kg 98% phosphonic acid [$H_3PO_3$], iii) 18.60 kg iron(III) phosphate dihydrate [$FePO_4$ $2H_2O$]

IV) 8.85 kg manganese carbonate hydrate [$MnCO_3$ $H_2O$]

IV) 29.8 kg 50% lye [KOH]

Figure 7:
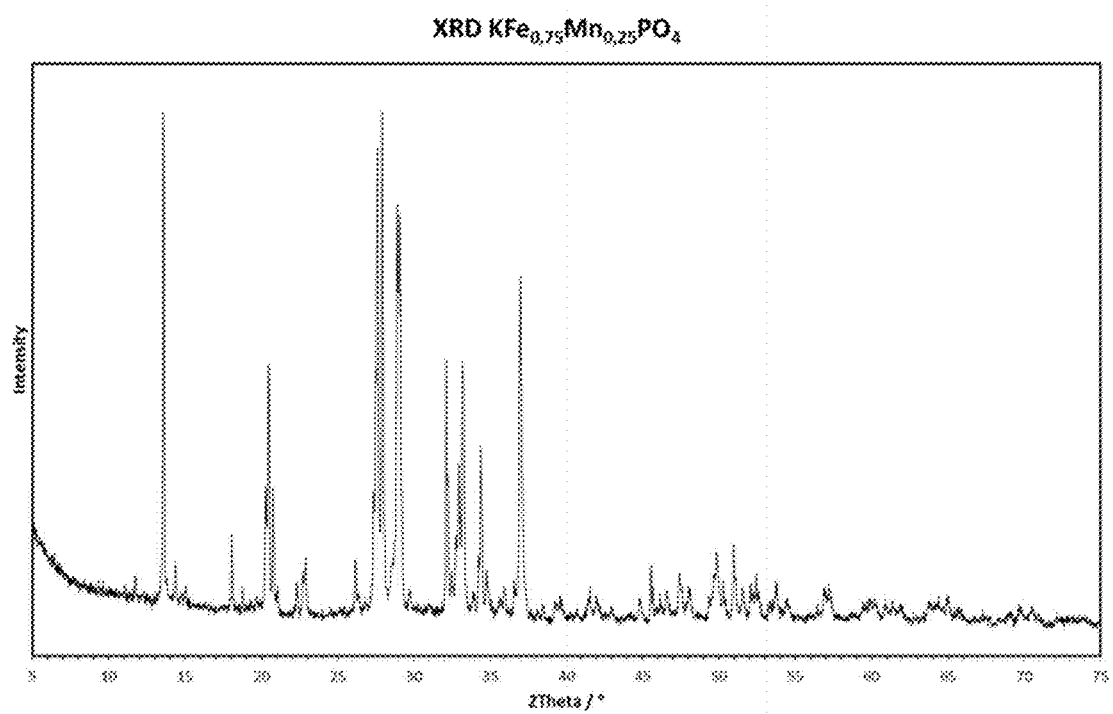
FIG. 7 shows the x-ray diffractogram of crystal water-free $KFe_{0.75}Mn_{0.25}(PO_4)$ manufactured in accordance with the invention in line with manufacturing example 7.

V) 9.30 kg 75% phosphoric acid [$H_3PO_4$] and solvent: 140 kg water was spray granulated. The granulate obtained in this way was temperature treated in a rotary kiln for an average residence time of 2 h in a forming gas atmosphere (5% by volume $H_2$ in $N_2$) at 600° C. A light grey product is obtained. The x-ray diffractogram (XRD) of the product is shown in FIG. 7. The product is not known from the literature. It crystallises in an isotype manner to $KFe(PO_4)$ according to PDF card 01-076-4615.

Manufacturing Example 8—Crystal Water-Free $BaFeP_2O_7$

A suspension of i) 8.70 kg iron(III) oxide-hydroxide [FeO(OH) or $Fe_2O_3$ $1H_2O$], ii) 8.20 kg 98% phosphonic acid [$H_3PO_3$], iii) 19.05 kg iron(III) phosphate dihydrate [$FePO_4$ $2H_2O$]

IV) 63.09 kg barium hydroxide octahydrate [$Ba(OH)_2$ $8H_2O$]

Figure 8:
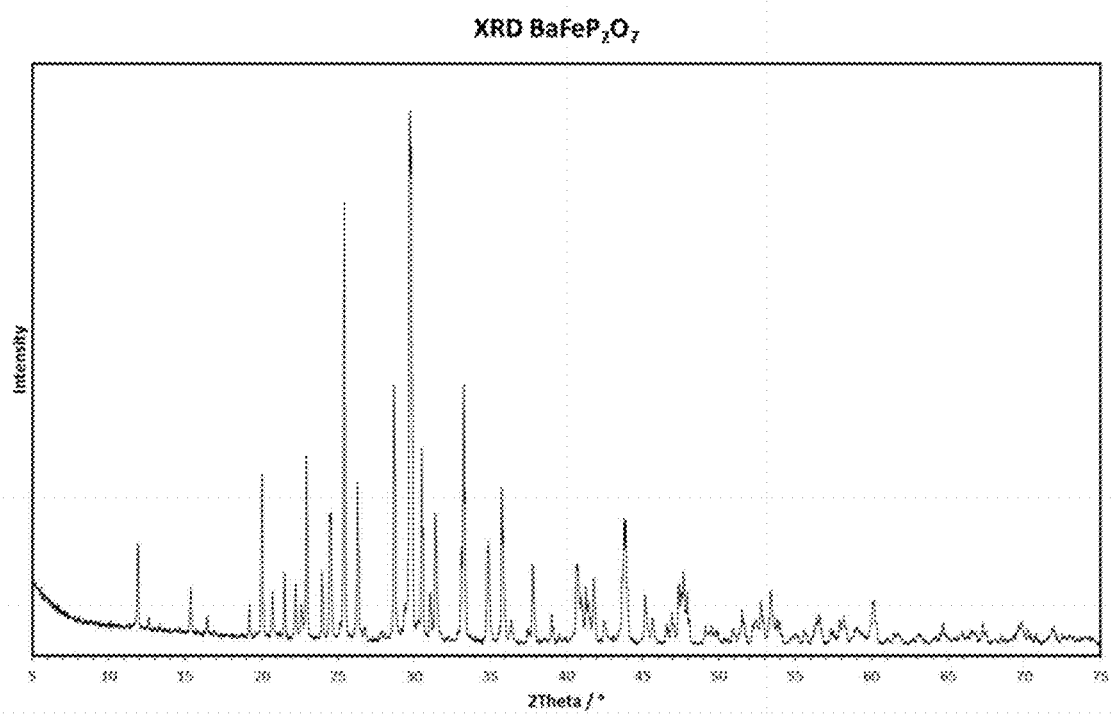
FIG. 8 shows the x-ray diffractogram of crystal water-free $BaFeP_2O_7$ manufactured in accordance with the invention in line with manufacturing example 8.

V) 26.15 kg 75% phosphoric acid [$H_3PO_4$] and solvent: 250 kg water was spray granulated. The granulate obtained in this way was temperature treated in a rotary kiln for an average residence time of 4 h in a forming gas atmosphere (5% by volume $H_2$ in $N_2$) at 800° C. A light grey product is obtained. The x-ray diffractogram (XRD) of the product is shown in FIG. 8. The product crystallises in an isotype manner to form $BaCoP_2O_7$ according to PDF card 01-084-1833.

The following examples explain the method according to the invention.

Example 1

1 kg of copper hydroxide phosphate was put with 100 g titanium dioxide in a reactor with water and stirred for 1 h. The preparation obtained was filtered and dried at approx. 120° C. up to a water content of max. 0.5% by weight. The powder obtained was dry mixed with 1% by weight disodium dihydrogen phosphate, $Na_2H_2P_2O_7$. Five percent by weight of the mixture was worked into a PC/ABS copolymer by Sabic (LNP™COLORCOMP™ Compound NX05467) using an extruder (ZSK18-type by Coperion GmbH). The plastic was then processed with the aid of an injection moulding machine to form approx. 2 mm thick plates. The plates were irradiated with an Nd:YAG laser (Trumpf) with a wavelength of 1064 nm and structures were generated. Uniform metal separation (metal nuclei) took place which was suitable as conductive pathways or precursors of conductive pathways.

Example 2

Iron(II) magnesium phosphate of the formula $Fe_2Mg(PO_4)_2$ was dry mixed with 1% by weight disodium dihydrogen phosphate, $Na_2H_2P_2O_7$. Five percent by weight of the mixture was worked into a polyamide 6.6 (Ultramid™ by BASF) using an extruder (ZSK18-type by Coperion GmbH) and a granulate manufactured. The granulate was then further processed to form plates of 3 cm×4 cm×3 mm. The plates were irradiated with an Nd:YAG laser (Trumpf) with a wavelength of 1064 nm and electrically conductive structures were generated.

Example 3 (Comparison)

Three percent by weight copper hydroxide phosphate was worked into a polyamide 6.6 (Ultramid™ by BASF) using an extruder (ZSK18-type by Coperion GmbH). The extrusion was carried out at the upper end of the recommended temperature range at 285° C. In this case, there was undesired discolouration of the plastic. The initially slightly greenish compound changed its colour to brown.

In addition, a slight, but undesired separation of metallic copper on the shaft of the extruder was found.

Example 4

Four percent by weight copper hydroxide phosphate and 2 percent by weight sodium aluminium sulphate (SAS) were worked into a polyamide 6.6 (Ultramid™ by BASF) using an extruder (ZSK18-type by Coperion GmbH) and a granulate manufactured. The extrusion was carried out at the upper end of the recommended temperature range at 285° C. The granulate was then further processed to form plates of 3 cm×4 cm×3 mm. There was no undesired discolouration in the plastic and no deposition of metallic copper on the shaft of the extruder. The plates were irradiated with an Nd:YAG laser (Trumpf) with a wavelength of 1064 nm and structures were generated. Uniform formation of conductive structures took place which were suitable as conductive pathways or precursors of conductive pathways.

Example 5

Forty percent by weight iron(II) orthophosphate $Fe_3(PO_4)_2$ and 1 percent by weight sodium aluminium sulphate (SAS) were worked into an LDPE (Lupolen™ 1800 S by LyondellBasell) using an extruder (ZSK18-type by Coperion GmbH) and a granulate manufactured. The granulate was then further processed to form plates of 3 cm×4 cm×3 mm. There was a slight green colouration in the plastic, but no deposition on the shaft of the extruder. The plates were irradiated with an Nd:YAG laser (Trumpf) with a wavelength of 1064 nm and structures were generated. Uniform formation of conductive structures took place which were suitable as conducting pathways or precursors of conducting pathways.

The invention claimed is:

1. A method for manufacturing electrically conductive structures, comprising:
   providing a non-conductive carrier material which contains at least one inorganic metal phosphate compound and at least one stabiliser finely distributed or dissolved therein; and
   irradiating the carrier material in regions by laser beams generating the electrically conductive structures in the irradiated regions,
   wherein the at least one inorganic metal phosphate compound is copper hydroxide phosphate of the general formula $Cu_2(OH)PO_4$, and
   wherein the at least one stabiliser is selected from Lewis acids, wherein a Lewis acid is defined as a non-proton-transferring electron-deficient compound selected from sodium aluminium sulphate (SAS), dicalcium phosphate dihydrate (DCPD), sodium aluminium phosphate (SALP), calcium magnesium aluminium phosphate, calcium polyphosphate, magnesium polyphosphate, aluminium hydroxide, alkyl boranes, aluminium alkyls, iron(II) salts and mixtures of the foregoing.

2. The method according to claim 1, wherein metal is chemically reductively or electrolytically deposited on the electrically conductive structures generated by means of laser beams.

3. The method according to claim 1, wherein the non-conductive carrier material contains the at least one inorganic metal phosphate compound in a quantity of 0.01% by weight to 45% by weight in relation to the total mass of the composition made up of the sum of the mass of the non-conductive carrier material and added materials.

4. The method according to claim 1, wherein the non-conductive carrier material contains the at least one stabiliser in a quantity of 0.01% by weight to 25% by weight in relation to the total mass of the composition made up of the sum of the mass of the non-conductive carrier material and added materials.

5. The method according to claim 1, wherein the non-conductive carrier material also contains at least one synergist, which is selected from metal phosphates, metal oxides or mixtures thereof.

6. The method according to claim 5, wherein the non-conductive carrier material contains the at least one synergist in a quantity of 0.01% by weight to 15% by weight in relation to the total mass of the composition made up of the sum of the mass of the non-conductive carrier material and added materials.

7. The method according to claim 1, wherein the non-conductive carrier material is selected from the group consisting of thermoplastic polymers, thermosetting polymers, elastomers, glasses, ceramics, natural or synthetic varnishes, natural or synthetic resins, silicones or combinations thereof.

8. The method according to claim 1, wherein the non-conductive carrier material is selected from the group consisting of polyvinyl butyral (PVB), polypropylene (PP), polyethylene (PE), polyamide (PA), polyesters, polybutylene terephthalate (PBT), polyethylene terephthalate (PET), polyphenylene oxide, polyacetal, polymethacrylate, polyoxymethylene, polyvinyl acetal, polystyrene, acrylonitrile butadiene styrene (ABS), acrylonitrile styrene acrylate (ASA), polycarbonate, polyethersulfone, poly sulfonate, polytetrafluoroethylene, polyurea, formaldehyde resin, melamine resin, polyetherketone, polyvinyl chloride, polylactide, polysiloxane, phenol resin, epoxide resin, poly(imide), bismaleimide-triazine, thermoplastic polyurethane, copolymers and/or mixtures of the polymers mentioned above.

9. The method according to claim 1, wherein the laser beam has a wavelength in the region of 200 nm to 12000 nm.

* * * * *